United States Patent [19]

Riemenschneider et al.

[11] Patent Number: 5,225,363
[45] Date of Patent: Jul. 6, 1993

[54] TRENCH CAPACITOR DRAM CELL AND METHOD OF MANUFACTURE

[75] Inventors: Bert R. Riemenschneider, Murphy; Allan T. Mitchell, Garland; Clarence W. Teng, Plano, all of Tex.

[73] Assignee: Texas Instruments Incorporated, Dallas, Tex.

[21] Appl. No.: 823,804

[22] Filed: Jan. 15, 1992

Related U.S. Application Data

[60] Division of Ser. No. 287,937, Dec. 21, 1988, Pat. No. 5,105,245, which is a continuation-in-part of Ser. No. 212,452, Jun. 28, 1988, Pat. No. 4,958,206.

[51] Int. Cl.$^5$ .................................... H01L 21/70
[52] U.S. Cl. ........................................ 437/47; 437/48; 437/52; 437/60; 437/919
[58] Field of Search .................. 437/47, 48, 52, 60, 437/203, 228; 357/23.6; 365/149

[56] References Cited

U.S. PATENT DOCUMENTS

| | | | |
|---|---|---|---|
| 3,961,355 | 6/1976 | Abbas et al. | 357/49 |
| 4,003,036 | 1/1977 | Jenne . | |
| 4,017,885 | 4/1977 | Kendall et al. | 357/51 |
| 4,105,475 | 8/1978 | Jenne | 148/175 |
| 4,115,795 | 9/1978 | Masuoka et al. | 357/24 |
| 4,116,720 | 9/1978 | Vinson | 148/1.5 |
| 4,119,772 | 10/1978 | Natori et al. | 357/23 |
| 4,164,751 | 8/1980 | Tasch, Jr. | 357/41 |
| 4,225,945 | 9/1980 | Kuo | 365/149 |
| 4,262,296 | 4/1981 | Shealy et al. | 357/55 |
| 4,319,342 | 3/1982 | Scheuerlein | 365/149 |
| 4,327,476 | 5/1982 | Iwai et al. | 29/571 |
| 4,353,086 | 10/1982 | Jaccodine et al. | 357/51 |

(List continued on next page.)

FOREIGN PATENT DOCUMENTS

| | | |
|---|---|---|
| 66081 | 12/1982 | European Pat. Off. . |
| 88451 | 3/1983 | European Pat. Off. . |
| 108390 | 5/1984 | European Pat. Off. . |
| 118878 | 9/1984 | European Pat. Off. . |
| 167764 | 1/1986 | European Pat. Off. . |
| 176254 | 4/1986 | European Pat. Off. . |
| 186875 | 7/1986 | European Pat. Off. . |
| 198590 | 11/1986 | European Pat. Off. . |
| 2706155 | 8/1978 | Fed. Rep. of Germany . |
| 3508996 | 10/1985 | Fed. Rep. of Germany . |
| 3525418A1 | 1/1986 | Fed. Rep. of Germany . |
| 51-13017 | 12/1976 | Japan . |
| 55-11365 | 1/1980 | Japan . |
| 55-133574 | 10/1980 | Japan . |
| 56-51854 | 5/1981 | Japan . |
| 57-10973 | 1/1982 | Japan . |
| 57-109367 | 7/1982 | Japan . |
| 58-3269 | 1/1983 | Japan . |
| 58-10861 | 1/1983 | Japan . |
| 58-204568 | 11/1983 | Japan . |
| 58-213464 | 12/1983 | Japan . |
| 59-103373 | 6/1984 | Japan . |
| 59-141262 | 8/1984 | Japan . |
| 59-181661 | 10/1984 | Japan . |
| 60-12752 | 1/1985 | Japan . |
| 60-182161 | 9/1985 | Japan . |
| 60-213053 | 10/1985 | Japan . |

(List continued on next page.)

OTHER PUBLICATIONS

Jambotkar; IBM TDB, vol. 27, No. 2, Jul. 1984; pp. 1313-1320 shows a memory cell formed in a trench.
Chang et al.; IBM TDB; vol. 22, No. 8B; Jan. 1980; pp. 3683-3688 shows a vertical dRAM cell using either a V-groove or a U-groove.

(List continued on next page.)

Primary Examiner—Tom Thomas
Attorney, Agent, or Firm—Richard A. Stoltz; James C. Kesterson; Richard L. Donaldson

[57] ABSTRACT

A plurality of trenches (26, 28) of a DRAM cell array formed in a (P—) epitaxial layer (11) and a silicon substrate (12), and storage layers (38, 40) are grown on the sidewalls (34, 36) and bottom (not shown) of the trenches (26, 28). Highly doped polysilicon capacitor electrodes (42, 44) are formed in the trenches (26, 28). Sidewall oxide filaments (50, 54) and in situ doped sidewall conductive filaments (66, 68) are formed and thermal cycles are used to diffuse dopant from sidewall conductive filaments (66, 68) into upper sidewall portions (62, 64) to form diffused source regions (70, 72) of pass gate transistors (90) for each cell.

2 Claims, 2 Drawing Sheets

U.S. PATENT DOCUMENTS

| | | | |
|---|---|---|---|
| 4,364,074 | 12/1982 | Garnache et al. | 357/23 |
| 4,369,564 | 1/1983 | Hiltpold | 29/571 |
| 4,397,075 | 8/1983 | Fatula, Jr. et al. | 29/571 |
| 4,412,237 | 10/1983 | Matsummura et al. | 357/42 |
| 4,432,006 | 2/1984 | Takei | 357/23 |
| 4,434,433 | 2/1984 | Nishizawa | 357/22 |
| 4,462,040 | 7/1984 | Ho et al. | 357/23 |
| 4,472,240 | 9/1984 | Kameyama | 156/648 |
| 4,476,623 | 10/1984 | El-Kareh | 29/576 |
| 4,536,785 | 8/1985 | Gibbons | 357/54 |
| 4,568,958 | 2/1986 | Baliga | 357/23.4 |
| 4,630,088 | 12/1986 | Ogura et al. | 357/23.6 |
| 4,636,281 | 1/1987 | Buiguez et al. | 156/643 |
| 4,649,625 | 3/1987 | Lu | 29/571 |
| 4,650,544 | 3/1987 | Erb et al. | 156/653 |
| 4,651,184 | 3/1987 | Malhi | 357/23.6 |
| 4,670,768 | 6/1987 | Sunami et al. | 357/42 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,702,795 | 10/1987 | Douglas | 156/643 |
| 4,704,368 | 11/1987 | Goth et al. | 437/60 |
| 4,717,942 | 1/1988 | Nakamura et al. | 357/23.6 |
| 4,721,987 | 1/1988 | Baglee et al. | 357/23.6 |
| 4,751,557 | 6/1988 | Sunami et al. | 357/23.6 |
| 4,751,558 | 6/1988 | Kenney | 357/23.6 |
| 4,763,181 | 8/1988 | Tasch, Jr. | |
| 4,801,988 | 1/1989 | Kenney | 357/23.6 |
| 4,916,524 | 4/1990 | Teng et al. | 357/23.6 |
| 4,945,069 | 7/1990 | Carter | 437/203 |
| 5,016,776 | 4/1992 | Shen et al. | 437/52 |

FOREIGN PATENT DOCUMENTS

| | | |
|---|---|---|
| 60-261165 | 12/1985 | Japan . |
| 61-36965 | 2/1986 | Japan . |
| 61-73366 | 4/1986 | Japan . |
| 1084937 | 9/1967 | United Kingdom . |
| 2002958 | 2/1979 | United Kingdom . |
| 2168195A | 12/1985 | United Kingdom . |

OTHER PUBLICATIONS

Chang et al.; IBM TDB, vol. 22, No. 7; Dec. 1979; pp. 2768–2771 shows the use of filament remnants on the side of trenches as word lines.

Kenney; IBM TDB; vol. 23, No. 3; Aug. 1980; pp. 967–969 shows a double polysilicon Hi-C type dRAM cell formed so that portions of the cell are formed in a V-groove.

Lee et al.; IBM TDB; vol. 22, No. 8B; Jan. 1980; pp. 3630–3634 shows embodiments of V-groove dRAM cell.

Nakajima et al.; IEDM; 1984; pp. 240–243 shows a dRAM cell formed on a mesa of a substrate. The capacitor is formed surrounding the mesa.

"High Density Memory Cell Structure with two Access Transistors", *IBM Technical Disclosure Bulletin*, pp. 409–414, vol. 31, No. 7, Dec. 1988.

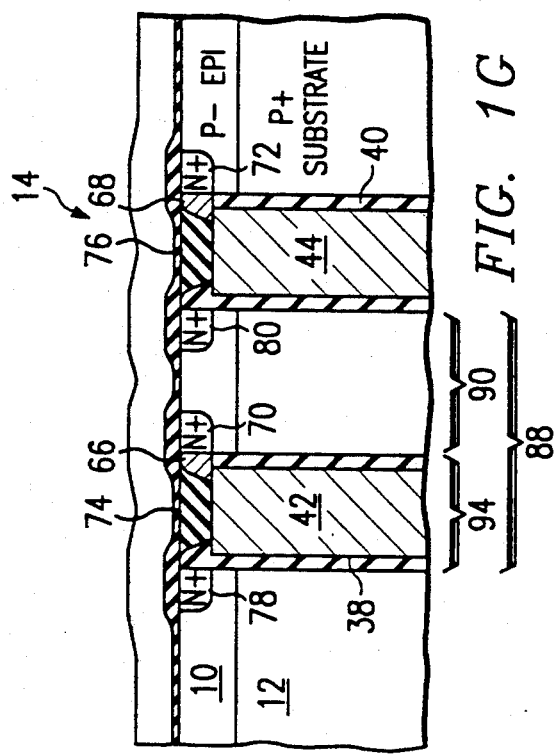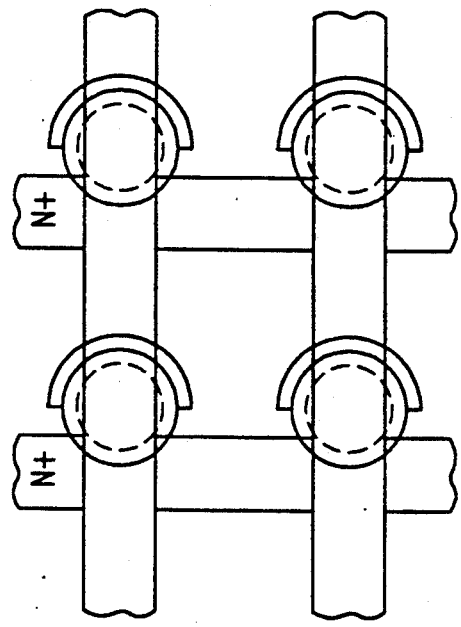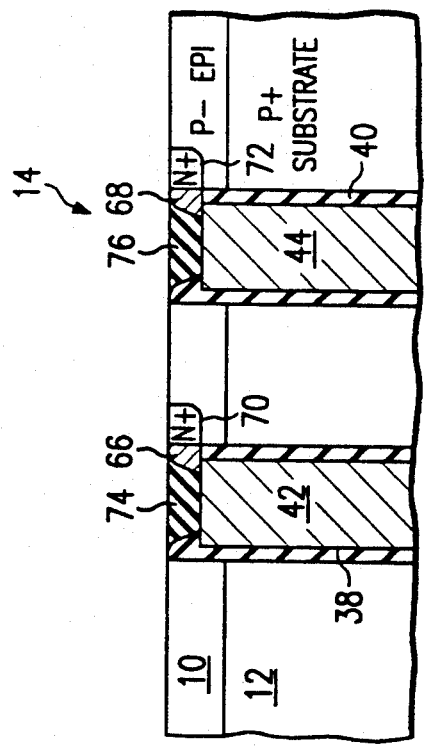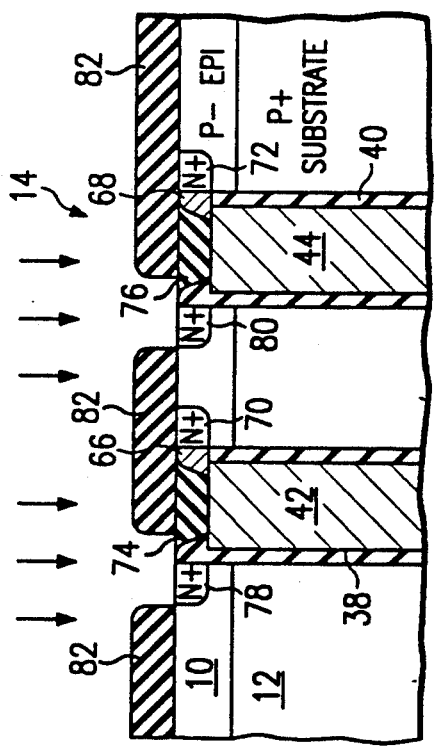

TRENCH CAPACITOR DRAM CELL AND METHOD OF MANUFACTURE

This is a division of application Ser. No. 07/287,937, filed Dec. 21, 1988, now U.S. Pat. No. 5,105,245, which is a continuation in part of application Ser. No. 07/212,452 filed Jun. 28, 1988, now U.S. Pat. No. 4,958,206.

TECHNICAL FIELD OF THE INVENTION

This invention relates in general to trench capacitor memory cells, and more particularly to a minimum dimension memory cell with a trench capacitor and a diffused bit line.

BACKGROUND OF THE INVENTION

Trench capacitor dynamic random access memory (DRAM) cells have recently been developed in a continuing effort to fit the maximum charge storage capacity into the smallest space. Most conventional DRAM cells of this type comprise a capacitor trench having a storage oxide grown on its sidewalls. A grounded capacitor electrode fills this trench, and an (N+) doped region surrounds the trench in the semiconductor layer and extends to form a source region for the corresponding field effect pass gate transistor. A (P) pass gate channel region connects the source region to an (N+) diffused drain region of the pass gate transistor.

In such previously developed DRAMs, an undesirably large space is required to be laid out between the side of the trench capacitor opposite the pass gate transistor and the next cell. This is because a parasitic transistor will otherwise form between the (N+) implantation surrounding the capacitor trench and the (N+) drain region of the next pass gate transistor. Prior attempts to minimize these parasitic transistors include providing local oxide isolating structures that still take up an undesirably large amount of cell area.

More recently, Lu et al. have proposed a trench capacitor memory cell that stores the charge on the trench electrode rather than in a surrounding diffused region (N.C. Lu, "A Substrate Plate Trench Capacitor (S.P.T.) Memory Cell for Dynamic RAMs", *IEEE Journal of Solid State Circuits*, Vol. SC-21, No. 5, pages 627-633 (October, 1986)). In this cell, a conductive plate connects an upper surface of the capacitor electrode to an adjacent source region of the pass gate transistor, spanning the capacitor storage oxide on the surface of the epitaxial layer. A metallic bit line is coupled to a drain region of the pass gate transistor.

This proposed cell has the disadvantage of requiring at least two layers of metal or other conductor, thus complicating the cell's fabrication. A need therefore exists for a minimum-dimension trench capacitor DRAM cell that requires only one level of metal interconnect, while at the same time avoiding the large spacing requirements of conventional cells between the trench capacitor of one cell and the pass gate transistor of the neighboring cell.

Previously developed memory cells have utilized trench sidewall transistors. These transistors are more complicated to construct and are therefore less reliable. The present invention utilizes surface pass gate transistors which are simpler to construct and have more reliable operational parameters.

SUMMARY OF THE INVENTION

One aspect of the invention comprises a memory cell formed in a semiconductor layer of a first conductivity type. A trench is formed into a face of the semiconductor layer. A storage layer is formed on a major portion of the trench sidewalls to define a trench hole. A conductive capacitor electrode is formed in the trench hole such that its upper surface is below the face of the semiconductor layer. A sidewall oxide filament is formed on one side of the trench above the conductive capacitor electrode. A doped sidewall conductive filament is formed on the opposite wall of the trench, and through thermal steps dopant is diffused into the adjacent substrate to form a region of a second conductivity type which serves as a diffused region of a respective pass gate transistor. This diffused region is thereby electrically connected to the conductive capacitor electrode.

In another aspect of the invention, an array of trench capacitor memory cells is formed in the semiconductor layer. A plurality of spaced apart elongate bit lines of a second conductivity type are formed in the layer. These bit lines are formed using a self-aligned implant stage such that the bit line of one memory cell is immediately adjacent the sidewall of the trench of the adjacent memory cell. Additionally, a plurality of spaced apart elongate parallel conductive word lines are insulatively disposed over the face of the semiconductor layer at an angle to the bit lines. A plurality of memory cells are formed in between the bit lines. Each cell has a trench capacitor and a pass gate transistor. The diffused region adjacent to and electrically coupled with the capacitor electrode forms the source of the pass gate transistor. A transistor channel region of the first conductivity type is disposed on the semiconductor face between the diffused region and one of the bit lines. A thin pass gate insulator is formed on the face over the channel region, and one of the word lines is formed over the pass gate insulator for actuation of the transistor.

Yet another aspect of the invention comprises a method for fabricating a memory cell in a semiconductor layer. First, a trench is formed into the layer, followed by the formation of a sidewall storage layer on the sidewalls of the trench. A highly doped polycrystalline or amorphous material comprising silicon is deposited in the trench to form a capacitor electrode. A sidewall oxide filament is formed along one trench wall above the capacitor electrode. A doped sidewall conductive filament is formed along the opposite trench wall above the capacitor electrode. Through a thermal step, dopant from this conductive element diffuses into the substrate at the trench wall, forming the source of a pass gate transistor and electrically coupling this diffused source region with the capacitor electrode.

A significant technical advantage of the present invention is the absence of spacing between cells of the memory array. The implant of the bit line immediately adjacent each trench capacitor is a self-aligned implant process step and, therefore, no misalignment tolerance is required. Furthermore the cell has been configured such that the poly wordlines are not directly disposed over any unwanted portions of silicon preventing the formation of parasitic transistors. Diode isolation is therefore used to isolate each bit line from adjacent bit lines and adjacent source regions preventing the need for space consuming thick field isolation. Formation of such parasitic transistors is further inhibited by the fact that charge is stored in the capacitor electrode, rather than around the trench periphery, and no (N+) region is formed in the semiconductor layer around the trench. For these reasons, no parasitic transistor is formed between this region and the drain region of the pass gate transistor.

An additional technical advantage of the present invention in that it describes a minimum dimension memory cell with surface pass gate transistors as opposed to minimum dimension cells with trench sidewall transistors.

Another technical advantage of the invention is its avoidance of an extra layer of conductive interconnects. This advantage results from the use of a sidewall conductive filament to electrically couple the capacitor electrode to an adjacent source region of the pass gate transistor, together with the use of diffused bit lines rather than their metal or polysilicon counterparts. With 1.0 micron design rules, the cell size of the present invention can be scaled to approximately 2.5×3.8 microns or 7.5 square microns. The advantages of the present invention are equally applicable to even smaller design rules available as process techniques progress.

BRIEF DESCRIPTION OF THE DRAWINGS

A more complete understanding of the present invention may be derived by referring to the detailed description and claims when considered in conjunction with the accompanying drawings in which like reference numbers indicate like features throughout the drawings, and wherein:

FIGS. 1A-1G are schematic elevational cross sectional views that depict a plurality of successive processing steps that create a DRAM memory cell according to the invention; and FIG. 2 is a plan view of a portion of a DRAM memory cell array, a section taken substantially along line 1—1 corresponding to the cross section lines shown in FIGS. 1A-1G.

DETAILED DESCRIPTION OF THE INVENTION

Figure 1C:
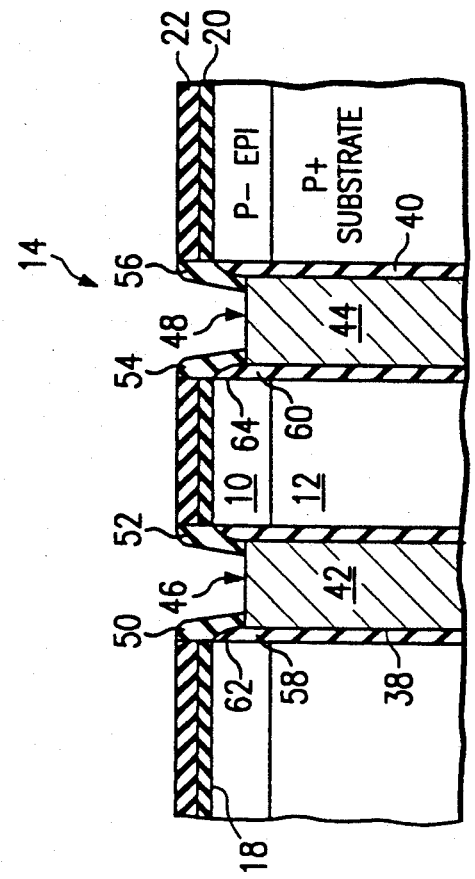
Figure 1D:
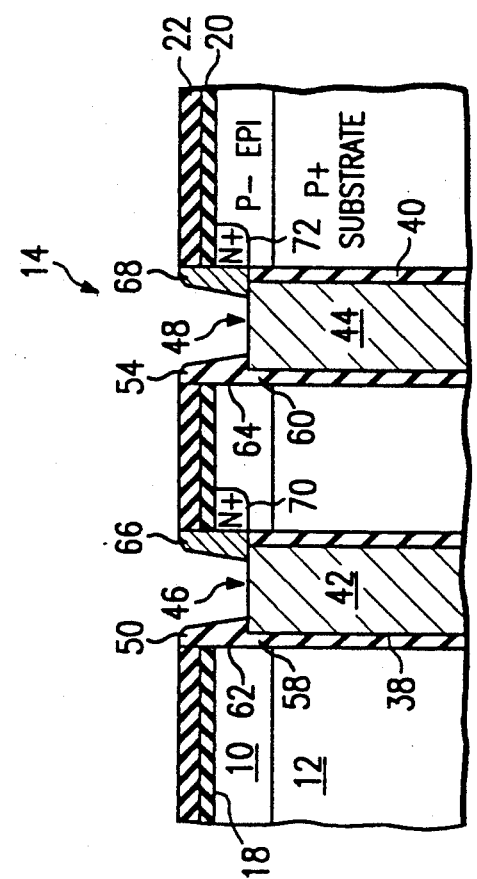
Figure 1A:
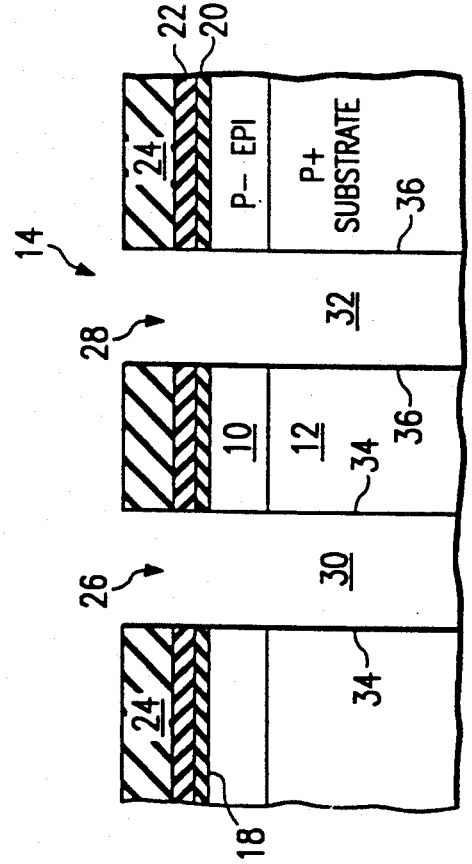

FIG. 1A is a greatly enlarged sectional view showing the beginning stages of fabrication of a DRAM cell according to the invention. A DRAM cell is indicated generally at 10. A (P−) epitaxial layer 11 is formed on a (P+) semiconductor substrate 12. Epitaxial layer 11 is doped with boron to provide a concentration on the order of $10^{15}$ ions per cubic centimeter. Substrate 12 is similarly doped with boron to provide a concentration level on the order of $10^{19}$ ions per cubic centimeter. Alternate dopant species similar to boron could also be utilized to provide the same conductivity parameters for epitaxial layer 11 and substrate 12. The portion of substrate 12 and epitaxial layer 11 shown is one portion of an active region which repeats the same pattern. An important aspect of the invention is that neighboring memory cells are immediately adjacent one another, and do not require the large spacing or field oxide separation of the prior art.

As shown in FIG. 1A, an oxide/nitride/oxide hard mask is formed over an outer surface 18 of epitaxial layer 11. This tri-layer mask includes a first, thin oxide layer 20 that is grown from epitaxial layer 11 until layer 20 is about 350 Angstroms in thickness. This is followed by the formation of a nitride layer 22 that is about 1500 Angstroms thick. The deposition of nitride layer 22 is followed by a second, thick oxide layer 24 whose thickness falls in the range 5000 to 10,000 Angstroms. The oxide/nitride/oxide hard mask is patterned with a layer of photoresist (not shown) in order to define trench areas 26 and 28. The hard mask is then plasma etched in a single step with $CHF_3/C_2F_6$ chemistry.

Next, trenches 30 and 32 are anisotropically etched with an etchant such as chlorine until they extend through epitaxial layer 11 into semiconductor substrate 12. It is preferable that trenches 30 and 32 be about six to ten microns deep. For simplicity of illustration, the deepest portions of trenches 30 and 32 are not shown in FIGS. 1A through 1G.

After trenches 30 and 32 have been etched, a hydrogen fluoride solution (HF) is used to remove any trench residues on the sidewalls 34 and 35 of trench 30 and the sidewalls 36 and 37 of trench 32, respectively. The HF solution will somewhat undercut first oxide layer 20 and will remove second thick oxide layer 24 of the oxide/nitride/oxide hard mask.

Figure 1B:
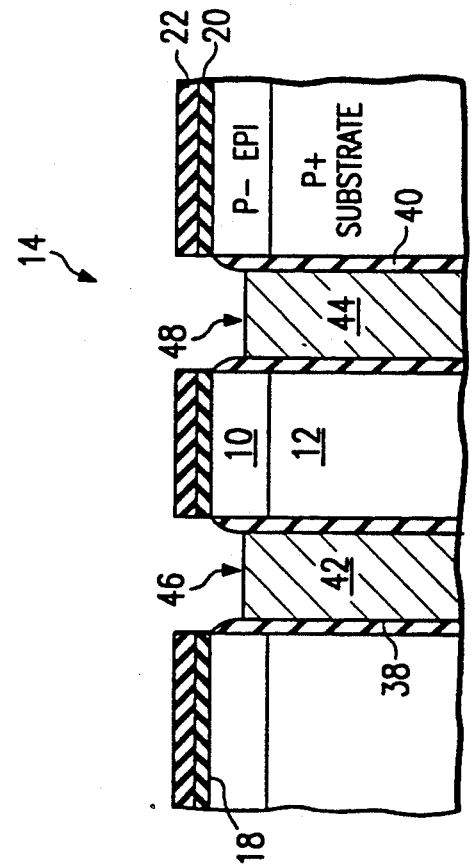

As shown in FIG. 1B, in the next step storage layers 38 and 40 are grown or deposited on sidewalls 34-37 as well as on the bottoms (not shown) of trenches 30 and 32. In one embodiment of the invention, storage layers 38 and 40 are oxides which are grown to be on the order of 100 to 150 Angstroms thick. In another embodiment (not shown), storage layers 38 and 40 are a tri-layer dielectric comprised of a first layer of oxide, a layer of nitride and a second layer of oxide.

A layer of heavily doped (N+) polycrystalline or amorphous silicon is then deposited as by low pressure chemical vapor deposition (LPCVD) on the surface of layer 22 and to fill trenches 30 and 32. This preferably polysilicon layer can have a phosphorus dopant concentration of $10^{20}$ ions per cubic centimeter. The polysilicon layer is etched back as with an $SF_6$ plasma or a wet etch to define trench capacitor electrodes 42 and 44 within trenches 30 and 32, respectively. The polysilicon layer is etched back such that upper surfaces 46 and 48 of respective electrodes 42 and 44 are recessed from outer surface 18 of epitaxial layer 10.

Turning next to FIG. 1C, a layer of oxide is conformally deposited and then anisotropically etched back to leave sidewall oxide filaments 50, 52, 54 and 56. A layer of photoresist is deposited over the structure and patterned such that filaments 50 and 54 are covered while oxide filaments 52 and 56 are exposed. The exposed filaments 52 and 56 are next etched and removed from the upper portion of respective sidewalls 35 and 37. This etch also removes upper storage layer portions 58 and 60 of storage layers 38 and 40. This leaves upper sidewall portions 62 and 64 of sidewalls 35 and 37 exposed from outer epitaxial surface 18 to the upper surfaces 46 and 48 of trench capacitor electrodes 42 and 44.

As shown in FIG. 1D, sidewall conductive filaments 66 and 68 are created by depositing a layer of polycrystalline or amorphous silicon as by low pressure chemical vapor deposition. This layer is in situ doped and etched back to produce highly conductive sidewall conductive filaments 66 and 68. These filaments are in direct contact with upper sidewall portions 62 and 64. During later thermal steps, dopant migrates from the highly doped conductive filaments 66 and 68 through upper sidewall portions 62 and 64 and into the epitaxial layer 11 to create respective diffused source regions 70 and 72. Diffused source regions 70 and 72 are electrically connected to respective trench capacitor electrodes 42 and 44 with source regions 70 and 72 through the sidewall conductive filaments 66 and 68.

As shown by FIG. 1E, in the next step a layer of oxide is deposited and the entire surface is planarized to leave oxide areas 74 and 76 covering respective upper surfaces 46 and 48 of trench capacitor electrodes 42 and 44. In the next step, shown in FIG. 1F, a layer of photoresist 82 is deposited and patterned to allow for the implant of bit lines 78 and 80 through outer surface 18 into epitaxial layer 11.

Several important aspects of the invention become apparent at this stage. Bit lines 78 and 80 are elongate parallel sections which run between the plurality of trenches which form the memory cell array. From the sectional view shown in FIGS. 1E and 1F, it is apparent that the implant of bit lines 78 and 80 is a self-aligned process step. Due to the protection of trench capacitor electrodes 42 and 44 by sidewall oxide filaments 50 and 54, and oxide areas 74 and 76, bit lines 78 and 80 may be implanted into epitaxial layer 10 immediately adjacent sidewall oxide filaments 50 and 54. Because of the positioning of sidewall oxide filaments 50 and 54, it becomes apparent that through diode isolation, bit lines 78 and 80 are electrically isolated from each other and from sources regions 70 and 72.

Because of this aspect of the invention, a bit line serving one memory cell may be placed immediately adjacent the sidewall of a trench capacitor of a neighboring memory cell. This aspect of the invention eliminates the necessity of spacing between cells and thereby greatly increases the possible density of memory arrays by doing away with the large field oxide boundaries required in the previously developed devices.

The final process steps are shown in FIG. 1G. First, photoresist layer 82 is stripped following the implant of bit lines 78 and 80. Next, gate oxide 84 is grown across the entire surface. Gate oxide 84 will grow slightly faster over bit lines 78 and 80, sidewall conductive filaments 66 and 68, and source regions 70 and 72 to help further electrically isolate these regions from gate-conductor/word-line 86 to be deposited on top of gate oxide 84. Gate-conductor/word-line 86 is patterned and etched using conventional methods from a layer of polycrystalline or amorphous silicon deposited on gate oxide 84.

FIG. 1G shows one complete memory cell 88 as well as portions of adjacent memory cells. From right to left, memory cell 88 comprises bit line 80 which forms the drain of a pass gate transistor indicated generally at 90. Pass gate transistor 90 further comprises channel region 92 and source region 70. Pass gate transistor 90 is electrically connected to trench capacitor 94 by sidewall conductive filament 66. Trench capacitor 94 comprises trench capacitor electrode 42 and storage layer 38.

In operation, pass gate channel region 92 is actuated when voltage is applied to gate-conductor/word-line 86. Pass gate channel region 92 is electrically insulated from gate-conductor/word-line 86 by gate oxide 84. Diffused source region 70 serves as the source for pass gate transistor 90 and is electrically connected to trench capacitor electrode 42 through sidewall conductive filament 66. When memory cell 88 is activated, charge is stored in trench capacitor 94. Semiconductor substrate 12 is field grounded to complete the circuit.

FIG. 2 shows a schematic plan view of a portion of a memory array formed in accordance with the present invention. Two complete memory cells are represented as well as portions of four adjacent cells. Bit lines 78 and 80 abut respective trench capacitor areas 26 and 28 at inner faces 96 and 98. Diode isolation is used to isolate bit line 78 from bit line 80 and from source region 72 preventing the need for space consuming thick field isolation. An important advantage of the present invention is that this minimizes the cell area. In any row, the bit line coupled to the last cell is formed to be self-aligned with the capacitor electrode of the next cell. Because of this aspect, with one micron design rules, the cell size of the invention can be scaled to approximately 2.5×3 microns or 7.5 square microns. The advantages of the present invention are equally applicable to smaller design rules.

The present invention differs from the related application, Ser. No. 212,452, Diffused Bit Line Trench Capacitor DRAM Cell by Teng et al., filed Jun. 28, 1988, in several key aspects. The present invention teaches the use of a conductive filament residing outwardly from the outer surface of the capacitor electrode to couple the pass gate transistor source region to the trench capacitor. Application Ser. No. 212,452 teaches the removal of a portion of the trench capacitor storage layer and the formation of a conductive plug to facilitate the coupling of the capacitor electrode and the pass gate transistor.

Further, the present invention includes the technical advantage that the bit lines abut neighboring trench capacitors due to the self-aligned implant step previously described. This feature greatly enhances the possible active area device density of a DRAM array constructed according to the teachings of the present invention.

An additional technical advantage of the present invention is that it describes a minimum dimension cell with surface pass gate transistor as opposed to minimum dimension cells with trench sidewall transistors. The surface pass gate transistor has advantages over the trench sidewall transistor pass gate in that processing is simpler, threshold voltage setting implant is more reliable, can be done at a lower energy and is uniform, it has a transistor channel region in <100> silicon with lower defect density and higher mobility than trench sidewall transistors and it has a more uniform gate oxide.

In summary, the present invention comprises a DRAM cell structure using a diffused bit line, sidewall conductive filaments to connect the capacitor electrode to a source region of the pass gate transistor and sidewall oxide filaments to isolate the self-aligned bit lines from neighboring memory cells. Due to the way the cell has been configured, diode isolation can be used to isolate a bit line from its neighboring bit lines and source regions preventing the need for thick field isolation and thus greatly reducing the size of the memory cell array.

While the preferred embodiments of the invention and its advantages have been illustrated by the above detailed description, the invention is not limited thereto but only by the scope and spirit of the appended claims.

What is claimed is:

1. A method for fabricating a memory cell at a face of a semiconductor layer of a first conductivity type comprising the steps of:

forming a trench into the semiconductor layer, said trench having a bottom surface and side surfaces;

forming a sidewall insulator layer on a portion of said side surfaces of said trench, said sidewall insulator layer not reaching up to said face of said semiconductor layer;

forming a capacitor electrode in said trench, said capacitor electrode formed from a doped semiconductor material and having an upper surface, said upper surface of said capacitor electrode leaving an upper portion of said sidewall insulator layer exposed;

forming an insulative body adjacent a first portion of said exposed portions of said sidewall insulator layer;

forming a conductive body adjacent a second portion of said exposed portions of said sidewall insulator layer, said conductive body contacting said upper surface of said capacitor electrode;

forming a first source/drain region of a transistor in said semiconductor layer adjoining said second portion of said exposed portions of said sidewall insulator layer such that said first region is electrically connected to said capacitor electrode through said conductive body; and forming a second source/drain region of said transistor adjoining an upper portion of a sidewall insulator layer and an insulative body of a neighboring memory cell, said second region and said first region defining a channel region of said transistor disposed between said first and second regions in said semiconductor layer.

2. The method of claim 2 and further including the steps of:

forming a gate insulator layer on said face of said semiconductor layer; and forming a gate conductor layer on said gate insulator layer such that said gate conductor layer is operable to electrically actuate said channel region.

* * * * *